US010490686B2

United States Patent
Dietz et al.

(10) Patent No.: US 10,490,686 B2
(45) Date of Patent: Nov. 26, 2019

(54) PHOTOCONDUCTOR FOR EMITTING AND/OR RECEIVING ELECTROMAGNETIC WAVES

(71) Applicant: FRAUNHOFER-GESELLSCHAFT ZUR FÖRDERUNG DER ANGEWANDTEN FORSCHUNG E.V., Munich (DE)

(72) Inventors: Roman Dietz, Berlin (DE); Björn Globisch, Berlin (DE); Thorsten Göbel, Berlin (DE); W. Ted Masselink, Berlin (DE); Mykhaylo Semtsiv, Berlin (DE)

(73) Assignee: FRAUNHOFER-GESELLSCHAFT ZUR FÖRDERUNG DER ANGEWANDTEN FORSCHUNG E.V., München (DE)

( * ) Notice: Subject to any disclaimer, the term of this patent is extended or adjusted under 35 U.S.C. 154(b) by 239 days.

(21) Appl. No.: 15/121,362

(22) PCT Filed: Feb. 25, 2014

(86) PCT No.: PCT/EP2014/053631
§ 371 (c)(1),
(2) Date: Aug. 24, 2016

(87) PCT Pub. No.: WO2015/127960
PCT Pub. Date: Sep. 3, 2015

(65) Prior Publication Data
US 2016/0372621 A1 Dec. 22, 2016

(51) Int. Cl.
*H01L 31/09* (2006.01)
*H01L 31/0352* (2006.01)

(52) U.S. Cl.
CPC ...... *H01L 31/09* (2013.01); *H01L 31/035209* (2013.01); *H01L 31/035281* (2013.01)

(58) Field of Classification Search
CPC ............ H01L 31/035209; H01L 31/09; H01L 31/035281
See application file for complete search history.

(56) References Cited

U.S. PATENT DOCUMENTS

| 9,018,646 B2 | 4/2015 | Sartorius et al. |
| 2002/0093738 A1 | 7/2002 | Kimura et al. |
| (Continued) | | |

FOREIGN PATENT DOCUMENTS

| JP | 3240277 A | 10/1991 |
| JP | 2000-294811 A | 10/2000 |
| (Continued) | | |

OTHER PUBLICATIONS

Roehle, H., et al.,"Next generation 1.5 µm terahertz antennas: mesa-structuring of InGaAs/InAlAs photoconductive layers", Optics Express, vol. 18, No. 3, Feb. 1, 2010, pp. 2296-2301.
(Continued)

*Primary Examiner* — Minh Loan Tran
(74) *Attorney, Agent, or Firm* — Maschoff Brennan

(57) ABSTRACT

A photoconductor for emitting and/or receiving electromagnetic waves is provided. The photoconductor comprises a material region comprising a first and a second section, wherein the second section provides a higher density of charge carrier trapping centers and/or recombination centers than the first section, and a confinement generating a sub-band structure of the charge carrier energy states in the material region. The first and the second section are arranged and configured in such a manner that a maximum of the carrier probability density of the sub-band ground state is located in one of these sections and a maximum of the carrier probability density of an excited sub-band state is located in the respective other section.

19 Claims, 1 Drawing Sheet

(56) References Cited

U.S. PATENT DOCUMENTS

| | | | |
|---|---|---|---|
| 2010/0200755 A1 | 8/2010 | Kawano et al. | |
| 2010/0309460 A1* | 12/2010 | Sargent | H01L 31/035209 356/218 |
| 2012/0266949 A1* | 10/2012 | Blakers | H01L 31/02168 136/256 |
| 2012/0292648 A1 | 11/2012 | Ono et al. | |
| 2014/0261611 A1* | 9/2014 | King | H01L 31/0352 136/244 |

FOREIGN PATENT DOCUMENTS

| | | |
|---|---|---|
| JP | 2003-204106 A | 7/2003 |
| JP | 2010-206176 A | 9/2010 |
| JP | 2012-255862 A | 12/2012 |
| JP | 2012-256843 A | 12/2012 |
| JP | 2013-172133 A | 9/2013 |
| WO | 2008/110329 A2 | 9/2008 |

OTHER PUBLICATIONS

Sartorius, B., et al.,"All-fiber terahertz time-domain spectrometer operating at 1.5 μm telecom wavelengths", Optics Express, vol. 16, No. 13, Jun. 23, 2008, pp. 9565-9570.

Japanese Office Action dated Jul. 18, 2017 for corresponding application No. 2016-553833.

\* cited by examiner

PHOTOCONDUCTOR FOR EMITTING AND/OR RECEIVING ELECTROMAGNETIC WAVES

CROSS-REFERENCE TO A RELATED APPLICATION

This application is a National Phase Patent Application of International Patent Application Number PCT/EP2014/053631, filed on Feb. 25, 2014.

BACKGROUND

The invention relates to a photoconductor for emitting and/or receiving electromagnetic waves.

Photoconductors are used, for example, as components of Terahertz antennas, wherein Terahertz radiation may be emitted by the photoconductor upon irradiating the antenna with an optical beat signal or a pulsed optical signal. The optical beat signal creates free carriers in the photoconductor which are accelerated by a voltage applied to the photoconductor, the accelerated free carriers generating radiation in the Terahertz region. A photoconductor for the generation of Terahertz radiation is disclosed, for example, in WO 2008/110329 A2. The photoconductor described in that reference comprises a photoconductive region confined between two semiconductor interfaces, wherein the semiconductor interfaces comprise impurities for trapping free charge carriers produced in the photoconductive region.

SUMMARY

It is an object of the invention to improve the efficiency of a photoconductor.

According to the invention, a photoconductor for emitting and/or receiving electromagnetic waves is provided, the photoconductor comprising
- a material region comprising a first and a second section, wherein the second section provides a higher density of charge carrier trapping centers and/or recombination centers than the first section,
- a confinement generating a sub-band structure of the charge carrier energy states in the material region, wherein the first and the second section are arranged in such a manner that a maximum of the carrier probability density for the sub-band ground state is located in one of these sections and a maximum of the carrier probability density of the (e.g. first) excited sub-band state is located in the respective other section.

The material region of the photoconductor provides a photoconductive region, wherein the confinement in configured in such a way that it allows efficient conversion of incoming light into electron-hole pairs (i.e. charge carriers), wherein a two-dimensional confinement (e.g. in a plane that extends parallel to the material region or a substrate on which the material region is arranged) or a three-dimensional confinement of the carriers may be realized. The confinement adds a sub-band structure to the intrinsic band structure of the material region.

The first section of the material region permits a high-mobility transport of charge carriers (e.g. in a direction parallel to a substrate) whereas the second section of the material region provides a short carrier lifetime and thus the necessary rapid decline of the photoconductivity. Thus, different from conventional photoconductors two material sections (the first and the second section of the material region) are used for the separate functions of providing the high-mobility transport of charge carriers and providing a rapid recombination of the carriers in the sub-band ground state.

More particularly, using two sections in the photoconductive material region permits the location of the trapping and/or recombination centers and thus the location of rapid charge carrier recombination to be adapted to the location of the charge carriers in the ground state. This adaptation in particular accelerates the recombination of the charge carriers and thus enhances the efficiency of the photoconductor.

For example, the first and the second section of the material region are arranged in such a manner that the maximum of the carrier probability density for carriers in the sub-band ground state is located in the second section and the maximum of the carrier probability density for carriers in the excited sub-band state of the carriers is located in the first section. In other word, the section of the material region comprising the higher density of trapping and/or recombination centers (i.e. the region with the shorter charge carrier lifetime) is provided in a region in which the carriers are predominantly located when they are in the sub-band ground state. On the other hand, the section with the lower density of trapping and/or recombination centers (i.e. the region with the longer charge carrier lifetime and thus higher mobility) is provided in a region in which carriers are predominantly located when they are in the excited sub-band state (e.g. the first excited sub-band state). It is noted that a "charge carrier" may either be an electron or a hole. More particularly, after the creation of free charge carriers by irradiating light onto the material region, the excited carriers might undergo a phonon assisted inter-sub-band relaxation (accompanied by an emission of phonons) into the ground state and finally recombine rapidly due to the high density of trapping centers of the second section.

However, it is also conceivable that conversely the first and the second section are arranged in such a manner that the maximum of the carrier probability density for carriers in the sub-band ground state is located in the first section and the maximum of the carrier probability density for carriers in the excited sub-band state of the carriers is located in the second section. According to this embodiment, the section of the material region comprising the higher density of trapping and/or recombination centers is located in region of the excited carriers while the section with the lower density of trapping and/or recombination centers is located in the region of the carriers in the sub-band ground state. In particular, in that embodiment the transition of the carriers into the trapping region (i.e. into the second section of the material region) may be accompanied by a phonon absorption process.

According to another embodiment of the invention, the material region is a first material region, wherein the confinement is provided by a second material region arranged adjacent the first material region (e.g. surrounding the first material region), the second material region having a band gap larger than the band gap of the first material region. The second material region e.g. consists of a wide band gap semiconductor material while the two sections of the first material region each may consist of (e.g. different) narrow-band gap materials. Moreover, the second material region may comprise a plurality of sub-layers, wherein, in particular, the average band gap energy of the sub-layers is higher than a pre-determined energy of the incoming photons.

For example, the photoconductor is configured to operate in a certain spectral range, i.e. the energy $E_{photon}$ of the incoming light lies in a pre-determinable range ($E_{min}<E_{photon}<E_{max}$), wherein the photoconductor may be optimized for absorbing light with the energy $E_{photon}$. The second material region may then have a band gap with an energy $E_{gap}(B)>E_{max}$ whereas the first and/or the second section of the first material region may have a band gap with an energy $E_{gap}(A)>E_{min}$ and $E_{gap}(C)>E_{min}$, respectively. Further, the first and the second material region may be tensile strained and/or compressively strained.

According to another embodiment of the invention, the photoconductor comprises a plurality of first material regions, each of them being confined by a second material region. Providing a stack of a plurality of first material regions and second material regions that enhance the light absorption properties of the photoconductor. In particular, the photoconductor comprises a package of layers forming the first material region and the second material region, wherein material layers of the first material region are arranged alternately with material layers of the second material region.

It is noted that the confinement does not necessarily have to be provided by a second material region adjoining the first material region. Rather, other means for realizing the confinement may be used. For example, the confinement is provided by a magnetic field.

Moreover, the material region of the photoconductor according to the invention comprises at least one doping material and/or crystal defects that generate the trapping centers and/or the recombination centers of the second section of the material region. For example, the higher density of trapping centers in the second section is provided by intensive doping of a narrow region of the second section (so-called "delta doping").

As already mentioned above, the first section of the material region may comprise or may consist of a different material than the second section. Further, the first section of the material region may comprise a plurality of sub-layers. For example, the first section is formed by two semiconductor layers (e.g. formed from the same material), wherein the second section (i.e. the section with the higher density of trapping centers) is formed by a semiconductor layer arranged between the semiconductor layers of the first section. The thickness of each one of the semiconductor layers of the first section may be larger than the thickness of the semiconductor layer of the second section.

It is, however, also possible that conversely the second section of the material layer is formed by two semiconductor layers and the first section is formed by a semiconductor layer arranged between the semiconductor layers of the second section. This variant in particular is used to adapt the location of the section with the higher trapping center density to the location of carriers in the excited sub-band state as mentioned above.

The semiconductor layers of the first section and the semiconductor layers of the second section may also be tensile and/or compressively strained.

Moreover, the first section and/or the second section of the material region is configured in such a way that a transfer of charge carriers between energy sub-bands generated by the confinement is possible through emission or absorption of phonons. Further, the material region may be configured in such a way that charge carriers in the form of electrons will be excited from the valence band into conduction band states when the material region is irradiated.

It is also possible that an interface between the first section and the second section of the material region is configured to provide increased scattering losses for carriers in the sub-band ground and/or in the first excited sub-band state.

The invention also relates to an antenna for transmitting and/or receiving electromagnetic radiation, in particular Terahertz radiation, comprising a photoconductor as described above. Further, the invention relates to an (ultrafast) photo-receiver and/or emitter comprising such an antenna for receiving or emitting electromagnetic radiation, in particular Terahertz radiation. For example, the photo-receiver and/or the emitter comprises several (e.g. two) electrical contacts for supplying and detecting a voltage across the photoconductor of the antenna. Further, the photoconductor may be formed as a mesa, wherein the electrical contacts are connected to opposite sides of the mesa.

BRIEF DESCRIPTION OF THE DRAWINGS

Embodiments of the invention are described hereinafter with reference to the drawings.

DETAILED DESCRIPTION

Figure 1:
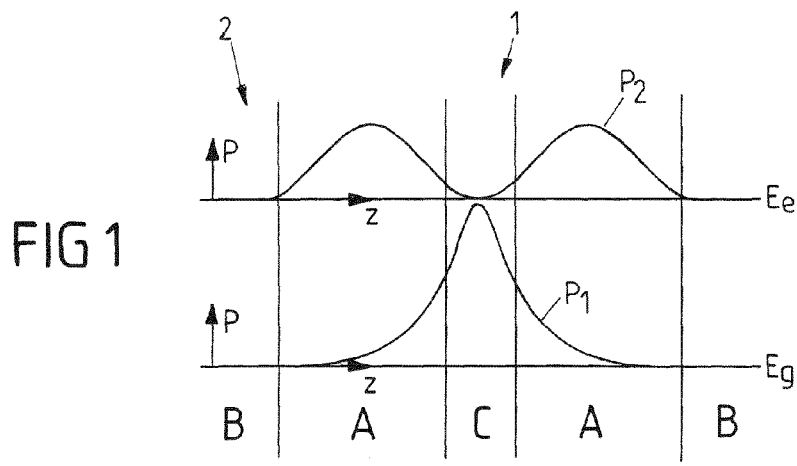
FIG. 1 shows schematically a layer structure of a photoconductor according to an embodiment of the invention.

FIG. 1 illustrates a section of an ultrafast photoconductor according to the invention. The photoconductor comprises a plurality of first material regions 1 and a plurality of second material regions 2 arranged adjacent the first material regions 1. The second material regions 2 each comprise two semiconductor layers B arranged on opposite sides of the first material regions 1 (i.e. below and above the first material regions 1). The first material regions 1 are formed as heterostructures comprising a first section formed by two semiconductor layers A and a second section formed by a semiconductor layer C arranged between the two semiconductor layers A. Layers A, B, C are alternately arranged on a substrate (not shown, wherein the substrate and thus the layers A, B, C will extend in the vertical direction with respect to FIG. 1) to form a layer packet, wherein FIG. 1 shows one period of the layer packet, only, i.e. one of the first material regions 1 and one of the second material regions 2 of the photoconductor.

The semiconductor material of the confinement layers B is a wide-band gap material having a larger band gap than the semiconductor material (narrow-band gap material) of the semiconductor layers A, C such that a two- or three-dimensional potential well is created spatially confining charge carriers created in the first material region 1. The potential well generates a sub-band structure superimposing the band structure of the semiconductor material of the semiconductor layers A, C, wherein FIG. 1 depicts the energy $E_g$ of the sub-band ground state (corresponding to a first quantized state) and the energy $E_e$ of the first excited sub-band state (corresponding to a second quantized state). More particularly, the layers A, C are thin such that a strong quantum confinement of charge carriers created in the first material region 1 is provided. For example, the thickness of each one of the layers A is smaller than 20 nm (but e.g. larger than 1 nm) and/or the thickness of each one of the layers C is smaller than 5 nm (but e.g. larger than 1 nm). The confinement layers B may have a thickness that is larger than 1 nm.

Further, layers A and/or layers C may be configured in such a way that a transition from the first excited sub-band state into the sub-band ground state is resonant with the longitudinal phonon in the layers A and/or C. In particular, the difference between the energy $E_e$ of the first excited sub-band state and the energy $E_g$ of the sub-band ground state is at least half the energy $E_{ph}$ of a longitudinal optical phonon in the layers A or C. In particular, the energy difference is $E_e - E_g = E_{ph} \pm \frac{1}{2} E_{ph}$, thereby permitting charge carriers generated in the first material region 1 to be transferred between the sub-band ground state and the first excited sub-band state by phonon emission or absorption.

The semiconductor material of layers A is a long-lifetime (i.e. high mobility and slow recombination) material, while the semiconductor material of layers C is a short-lifetime (i.e. low mobility and fast recombination) material. In particular, the material of layers C comprises a higher density of charge carrier trapping centers and/or recombination centers than the material of layers A. For this, layers C are intentionally doped with deep-level impurities such as Fe (see FIGS. 2 and 3) to provide the higher density of recombination centers.

FIG. 1 further illustrates the carrier probability density $P_1$ of the sub-band ground state (with respect to electrons in the energy sub-band ground state created in the first material region 1) and the electron probability density $P_2$ of the first excited sub-band state along a direction z (i.e. perpendicular to the layers A, B and C). As can be seen, the semiconductor layers A and C are arranged and configured in such a way that the carrier probability density $P_1$ of the sub-band ground state is located in the region of the semiconductor layer C, i.e. in the layer that comprises the higher recombination center density. The (two) maxima of the carrier probability density $P_2$ of the first excited sub-band state, however, is located in the region of semiconductor layers A (wherein a first maximum is located in one of the two layers A and a second maximum is located in the other one of the layers A). Thus, the first material section 1 provides a higher mobility for carriers in the first excited sub-band state than for carriers in the sub-band ground state and a fast decline of carriers in the sub-band ground state due to the high density of recombination centers impacting on the sub-band ground state carriers.

It is noted that, in principle, the roles of the semiconductor layer A and C could be changed, i.e. layer A could comprise the higher density of recombination centers while layer C is a high mobility material. This configuration could be used if carriers are transferred into the first excited sub-band state by a phonon absorption process.

Figure 2:
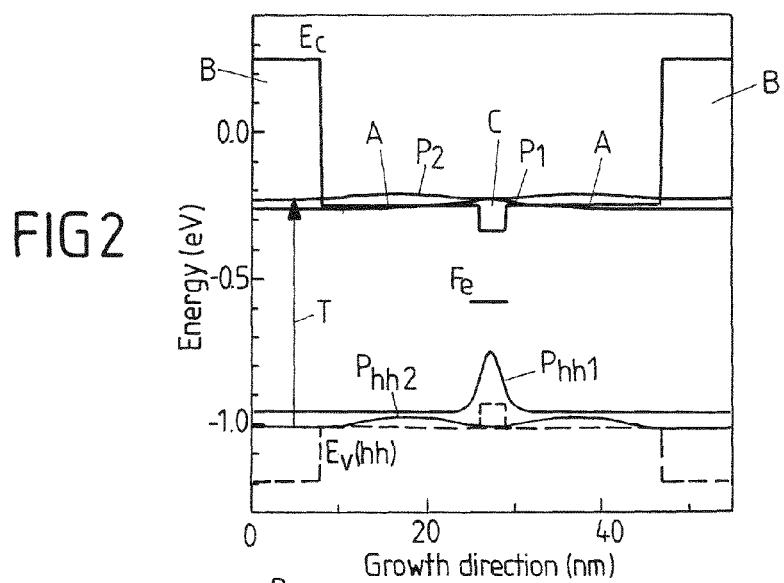
FIG. 2 shows possible conduction and valence bands of the layer structure shown in FIG. 1.

FIG. 2 illustrates an exemplary example of the layer configuration of FIG. 1, wherein the conductive and valence band edges of the first and the second material regions 1, 2 are shown along the growth direction (i.e. perpendicular to the substrate). "Ec" and "Ev(hh)" designate the energy of electrons in the conduction band and the energy of the valence band, respectively, in the region of layers A-C.

According to this embodiment, the semiconductor layers B each are formed by an InAlAs layer (e.g. an $In_{0.52}Al_{0.48}As$ layer having a thickness of e.g. 8 nm) lattice matched to an InP substrate. The semiconductor layers A are InGaAs layers (e.g. $In_{0.5}Ga_{0.5}As$ layers having a thickness of e.g. 18 nm), which may be slightly tensile strained with respect to the InP substrate. The layers C are InGaAs layers (e.g. $In_{0.73}Ga_{0.27}As$ layers having a thickness of e.g. 3 nm) compressively strained with respect to the InP substrate. Further, the layers C are doped with deep-level impurities (such as Fe, Cr, Rh, Ru and/or V) in order to permit ultrafast recombination of charge carriers in the sub-band ground state.

Of course, the invention is not limited to particular layer materials such that other materials, in principle, could be also used. Further, it is not necessary that the first one of the two layers A of the first material region 1 consists of the same material as the second one of the layers A. Also, the thickness of the two layers A of the first material region 1 may be different.

If the photoconductor is irradiated with light, electron-hole pairs will be generated, wherein electrons may be transferred from the valence band into the first excited sub-band state (indicated in FIG. 2 for electrons by the arrow "T") due to the photo effect. As set forth above, the carriers in the first excited sub-band state are localized in the semiconductor layers A and thus possess a high mobility such that they can be strongly accelerated in an electrical field generated across the photoconductor (the electrical field e.g. at least partially extending parallel to the semiconductor layers A, B, C). The accelerated charge carriers in the first excited sub-band state transmit the desired radiation (in particular Terahertz radiation).

Figure 3:
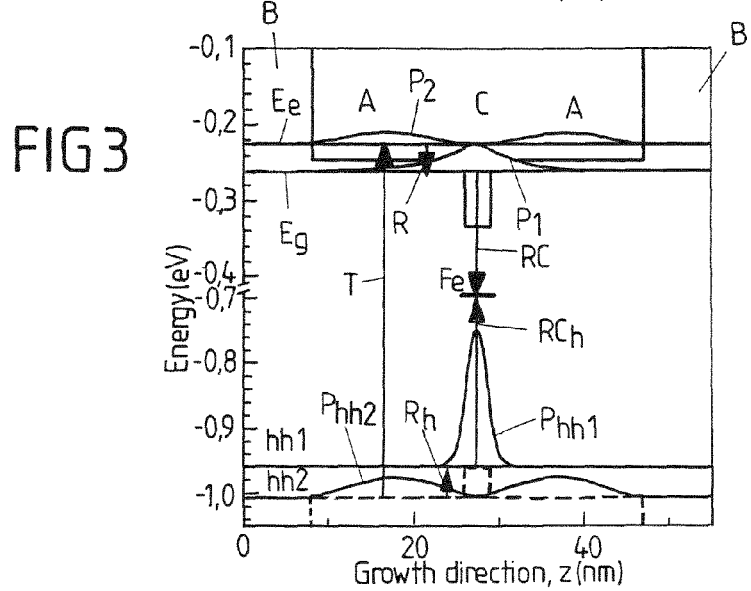
FIG. 3 shows an illustration of excitation and relaxation processes in the layer structure shown in FIG. 1.

As mentioned above, the difference between the energy $E_e$ of the first excited sub-band state and the energy $E_g$ of the sub-band ground state may be tuned to the energy of the longitudinal optical phonon in the first material region 1 such that carriers in the first excited sub-band state may undergo quick phonon-assisted intersubband relaxation into the sub-band ground state accompanied by a real space transfer into the layer C. The intersubband relaxation process is indicated for electrons by an arrow "R" FIG. 3, which is an enlarged view of FIG. 2. The carriers relaxed into the sub-band ground state will quickly recombine due to the high density of deep recombination centers. The recombination process is indicated in FIG. 3 by an arrow "RC".

It is noted that similar to electrons charge carriers in the form of holes can undergo an excitation and quick intersubband relaxation process. In particular, holes may be excited into a first excited sub-band hole state hh2 in which the holes move with high mobility (the corresponding hole probability density $P_{hh2}$ having maxima in the region of high mobility semiconductor layers A). The holes relax from a first excited sub-band hole state hh2 into a sub-band hole ground state hh1 (arrow $R_h$ in FIG. 3), wherein the holes in the sub-band hole ground state recombine quickly (the hole probability density $P_{hh1}$ having maxima in the region of low lifetime semiconductor layers C), the hole recombination process being indicated by an arrow "$RC_h$" in FIG. 3. Further, also the intersubband relaxation of holes can be resonant with the longitudinal optical phonon in the semiconductor layers A and/or C as in general already mentioned above.

It is further noted that the layer structure shown in FIG. 1 is only exemplarily. Other layer structures could be used instead. For example, at least some of the semiconductor layers A and/or at least some of the semiconductor layers C may comprises a plurality of sub-layers, wherein, in particular, the average band gap energy of these sub-layers is lower than a predetermined energy of the incoming photons.

REFERENCE SIGNS 1 first material region
2 second material region
A semiconductor layer forming first section of first material region
C semiconductor layer forming second section of first material region
B semiconductor layer of second material region
P1 carrier probability density of the sub-band ground state P2 carrier probability density of the first excited sub-band state
$P_{hh1}$ probability density of the hole sub-band ground state
$P_{hh2}$ probability density of the first excited hole sub-band state

The invention claimed is:

1. A photoconductor for emitting and/or receiving electromagnetic waves, comprising
   a material region comprising a first and a second section, wherein the second section provides a higher density of charge carrier trapping centers and/or recombination centers than the first section,
   a confinement generating a sub-band structure of charge carrier energy states in the material region,
   wherein the first and the second section are arranged and configured in such a manner that a maximum of carrier probability density of a sub-band ground state is located in one of the first and the second sections and a maximum of the carrier probability density of an excited sub-band state is located in a respective other section of the first and the second sections,
   wherein the first section and/or the second section of the material region is configured in such a way that a transfer of charge carriers between energy sub-bands generated by the confinement is possible through emission or absorption of phonons,
   wherein the material region is a first material region, wherein the confinement is provided by a second material region arranged adjacent the first material region, the second material region having a band gap larger than the band gap of the first material region,
   and wherein the second material region comprises two semiconductor layers arranged on opposite sides of the first material region.

2. The photoconductor as claimed in claim 1, wherein the first and the second section are arranged in such a manner that the maximum of the carrier probability density of the sub-band ground state is located in the second section and the maximum of the carrier probability density of the excited sub-band state is located in the first section.

3. The photoconductor as claimed in claim 1, wherein the first and the second section are arranged in such a manner that the maximum of the carrier probability density of the sub-band ground state is located in the first section and the maximum of the carrier probability density of the excited sub-band state is located in the second section.

4. The photoconductor as claimed in claim 1, further comprising a package of layers forming the first material region and the second material region.

5. The photoconductor as claimed in claim 1, wherein the second section of the material region provides a shorter carrier lifetime than the first section.

6. The photoconductor as claimed in claim 1, wherein the carrier mobility in the first section of the material region is different than the carrier mobility in the second section.

7. The photoconductor as claimed in claim 1, wherein the material region comprises at least one doping material and/or crystal defects that generate the trapping centers and/or the recombination centers of the second section.

8. The photoconductor as claimed in claim 7, wherein the first section is formed by two semiconductor layers and the second section is formed by a semiconductor layer arranged between the semiconductor layers of the first section.

9. The photoconductor as claimed in claim 8, wherein the thickness of each one of the semiconductor layers of the first section is larger than the thickness of the semiconductor layer of the second section.

10. The photoconductor as claimed in claim 8, wherein the semiconductor layers of the first section and the semiconductor layers of the second section are tensile and/or compressively strained.

11. The photoconductor as claimed in claim 1, wherein the first section of the material region comprises a different material than the second section of the material region.

12. The photoconductor as claimed in claim 1, wherein the first section of the material region comprises a plurality of sub-layers.

13. The photoconductor as claimed in claim 1, wherein the second section of the material region comprises a plurality of sub-layers.

14. The photoconductor as claimed in claim 13, wherein the second section of the material layer is formed by two semiconductor layers and the first section is formed by a semiconductor layer arranged between the semiconductor layers of the second section.

15. The photoconductor as claimed in claim 14, wherein the thickness of each one of the semiconductor layers of the second section is larger than the thickness of the semiconductor layer of the first section.

16. The photoconductor as claimed in claim 1, wherein the second material region comprises a plurality of sub-layers.

17. The photoconductor as claimed in claim 1, wherein the material region is configured in such a way that charge carriers in the form of electrons will be excited from a valence band into the excited sub-band state when the material region is irradiated.

18. The photoconductor as claimed in claim 1, wherein an interface between the first section and the second section of the material region is configured to provide increased scattering losses for carriers in the sub-band ground state and/or in the excited sub-band state.

19. An antenna for transmitting and/or receiving electromagnetic radiation, in particular Terahertz radiation, comprising a photoconductor as claimed in claim 1.

* * * * *